(12) United States Patent
Kutlu

(10) Patent No.: US 7,096,748 B2
(45) Date of Patent: Aug. 29, 2006

(54) EMBEDDED STRAIN GAUGE IN PRINTED CIRCUIT BOARDS

(75) Inventor: Zafer S. Kutlu, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 168 days.

(21) Appl. No.: 10/900,869

(22) Filed: Jul. 28, 2004

(65) Prior Publication Data
US 2006/0021453 A1 Feb. 2, 2006

(51) Int. Cl.
*G01L 1/23* (2006.01)
(52) U.S. Cl. ................................. 73/862.474
(58) Field of Classification Search ............ 73/862.474
See application file for complete search history.

(56) References Cited

U.S. PATENT DOCUMENTS

| | | | |
|---|---|---|---|
| 4,030,347 A * | 6/1977 | Norris et al. | 73/769 |
| 5,184,516 A * | 2/1993 | Blazic et al. | 73/799 |
| 5,526,208 A * | 6/1996 | Hatch et al. | 360/294.1 |
| 2004/0244495 A1* | 12/2004 | Weber et al. | 73/775 |

* cited by examiner

*Primary Examiner*—Edward Lefkowitz
*Assistant Examiner*—George Bonanto
(74) *Attorney, Agent, or Firm*—Christopher P. Maiorana, P.C.

(57) ABSTRACT

An apparatus generally having a circuit board and a first strain gauge is disclosed. The circuit board may have a plurality of insulating layers. The first strain gauge may be disposed between two of the insulating layers.

20 Claims, 4 Drawing Sheets

EMBEDDED STRAIN GAUGE IN PRINTED CIRCUIT BOARDS

FIELD OF THE INVENTION

The present invention relates to printed circuit boards generally and, more particularly, to an embedded strain gauge in a printed circuit board.

BACKGROUND OF THE INVENTION

Referring to FIGS. 1 and 2, a perspective drawing and a cross-sectional drawing of a conventional ball grid array (BGA) packaged component 10 mounted on printed circuit board (PCB) 12 are respectively shown. Multiple strain gauges 14a–14d are commonly mounted on the PCB 12 around the component 10 to characterize mechanical loading and strain to solder balls 16a–16n attaching the component 10 to the PCB 12. Attaching the strain gauges 14a–14b to the PCB 12 is cumbersome and extremely time consuming. The strain gages 14a–14d are attached on a top surface 18 of the PCB 12 and thus away from areas of interest. The strain gages 14a–14d cannot be placed between the component 10 and top surface 18 due to the solder balls 16a–16n. Therefore, measurements are taken away from solder balls 16a–16n or other locations that are important.

Furthermore, wiring from the strain gages 14a–14d commonly interferes with board level test equipment, such as in circuit test (ICT) or automated functional test (AFT) equipment. The strain gages 14a–14d are typically placed away from the board level test fixtures to avoid the interferences. Therefore, the board level test equipment interference makes measurements from the strain gauges 14a–14d inaccurate.

SUMMARY OF THE INVENTION

The present invention concerns an apparatus generally comprising a circuit board and a first strain gauge. The circuit board may have a plurality of insulating layers. The first strain gauge may be disposed between two of the insulating layers.

The objects, features and advantages of the present invention include providing an architecture and/or method for embedding strain gauges within a printed circuit board that may (i) provide accurate measurements of forces applied to the circuit board, (ii) avoid interference between strain gauge wiring and board level test equipment, (iii) avoid interference between strain gauge wiring and test fixtures, (iv) avoid interference between strain gauge wiring and edge connectors and/or (v) avoid interference between strain gauge wiring and test locations on the circuit board.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
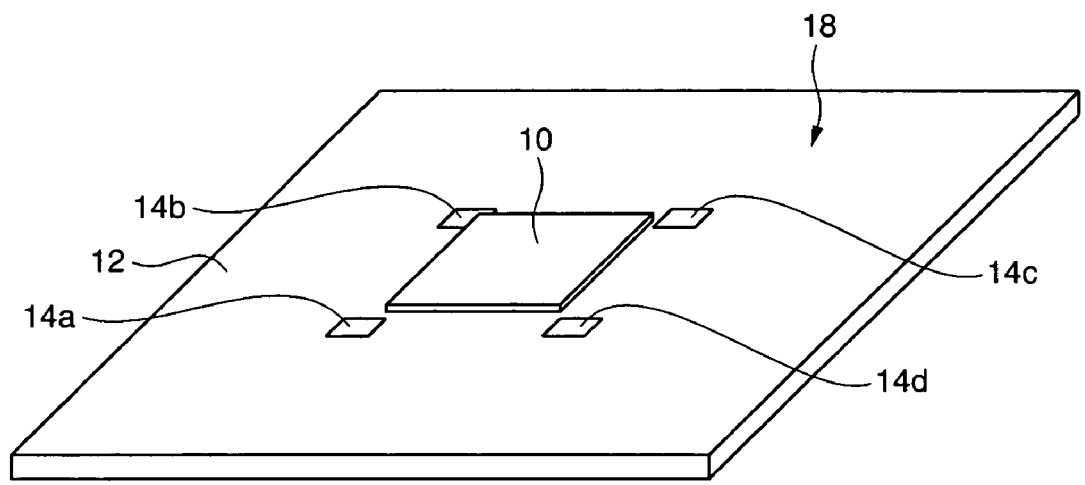
FIG. 1 is a perspective drawing of a conventional ball grid array packaged component mounted on printed circuit board.
Figure 2:
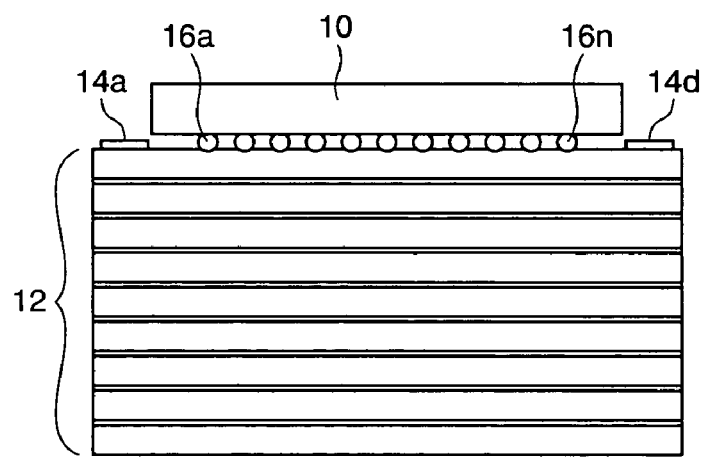
FIG. 2 is a cross-section drawing of FIG. 1.
Figure 3:
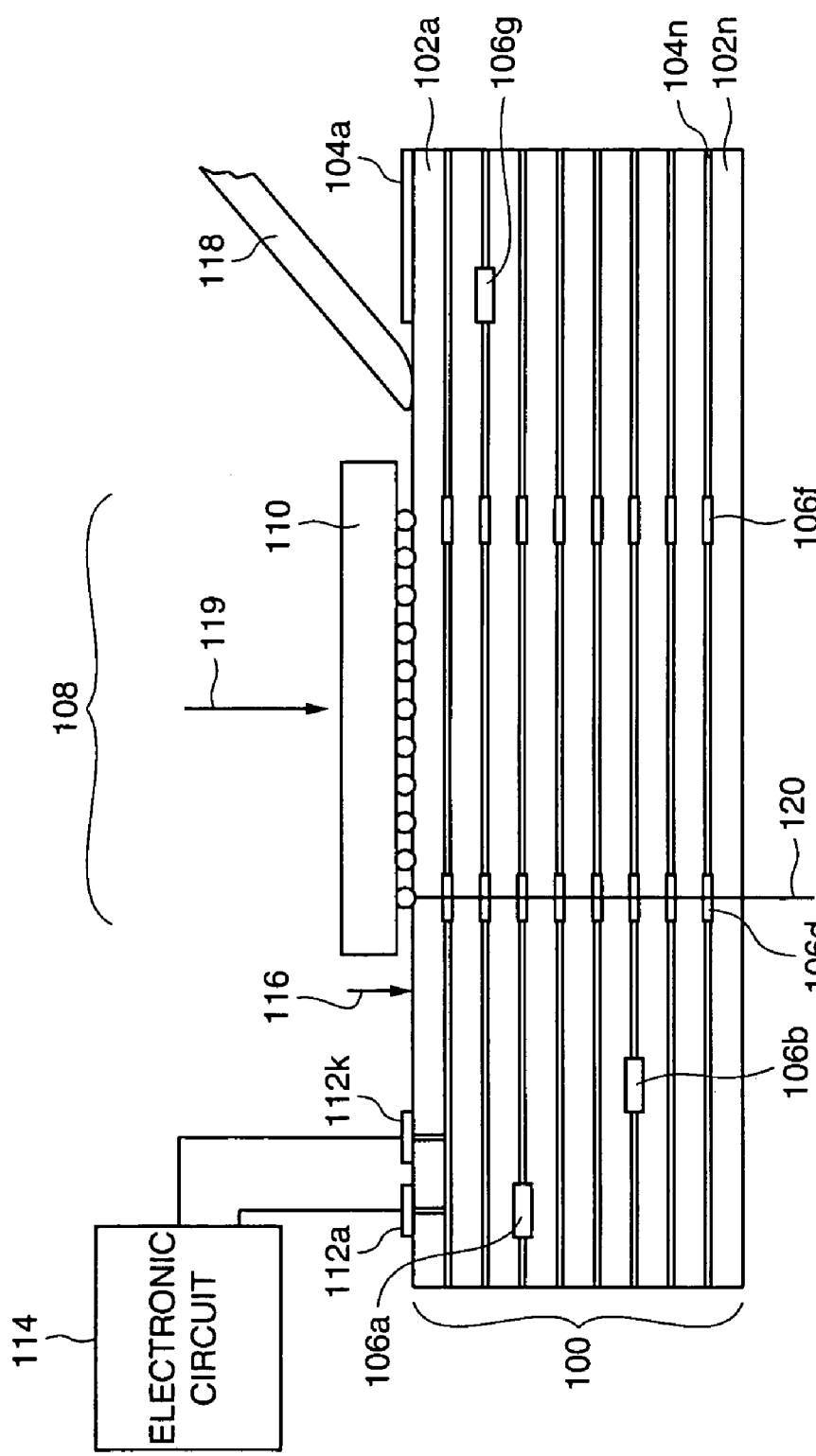
FIG. 3 is a cross-section drawing of a printed circuit board in accordance with a preferred embodiment of the present invention.

Referring to FIG. 3, a cross-section drawing of a printed circuit board 100 is shown in accordance with a preferred embodiment of the present invention. The printed circuit board (or "circuit board" for short) 100 generally comprises two or more layers 102a–102n, two or more layers 104a–104n and one or more strain gauges 106a–106g. One or more regions 108 (only one shown) may be defined where a component 110 may be mounted. Multiple interfaces 112a–112k may be formed on the layer 104a to provide communication between the strain gauges 106a–106g and an electronic circuit 114.

The layers 102a–102n may be implemented as electrically insulating layers. The layers 104a–104n may be implemented as electrically conductive layers. An alternating sequence of insulating layers 102a–102n and conductive layers 104a–104n may be arranged to form the circuit board 100. Each of the strain gauges 106a–106g may be disposed between two of the insulating layers 102a–102n.

One or more of the conductive layers 104a–104n may be patterned to create traces (FIG. 4) that connect the strain gauges 106a–106g to the interfaces 112a–112k. Generally, each conductive layer 104a–104n disposed between the same two insulating layers 102a–102n as a strain gauge 106a–106g may be etched to provide communications between the strain gauges 106a–106g and the interfaces 112a–112k. The conductive layers 104a–104n may be implemented as metal layers. The interfaces 112a–112k may be implemented as test pads, pins, external connectors or the like. The interfaces 112a–112k may be positioned on a top surface 116 of the circuit board 100 to avoid interference with other equipment 118 such as test probes, mechanical fixtures, sensors, edge connectors, test connectors and other test equipment.

The strain gauges 106a–106g may be mounted at different locations within the planes (e.g., X-Y planes) established by the insulating layers 102a–102n. In a particular embodiment, a strain gauge 106a–106g may be located approximate a corner in each quadrant of the region 108 Such a four strain gauge 106a–106g arrangement may be useful in measuring strains generated while a force 119 may be exerted to mount the component 110 within the region 108. The strain gauges 106a–106g may be used to measure strains generated during handling for different board assembly processes and tests, such as in circuit testing (ICT) and automated functional testing (AFT). The strain gauges 106a–106g may be located at other coplanar and/or non-coplanar positions in and around the region 108 and/or other regions to meet a design criteria of a particular application.

In another embodiment, some or all of the strain gauges 106a–106g may be located between different insulating layers 102a–102n. For example, two or more strain gauges 106a–106g may be positioned at different depths from the top surface 116 along a line 120 normal to the top surface 116 of the circuit board 100. The strain gauges 106a–106g do not have to be located at different depths along a normal line 120 or any other straight line. Locating the strain gauges 106a–106g at different depths may be useful for measuring various bending, bowing and/or twisting stresses applied to the circuit board 100. In general, the strain gauges 106a–106g may be mounted in any combinations of two or more layers to meet a design criteria of a particular application.

The component 110 may be implemented as an electronic component. For example, the component 110 may be an active electronic device such as an integrated circuit, transistor, multi-chip carrier or the like. The component 110 may also be implemented as a passive electronic element such as a resistor, capacitor and/or inductor.

Figure 4:
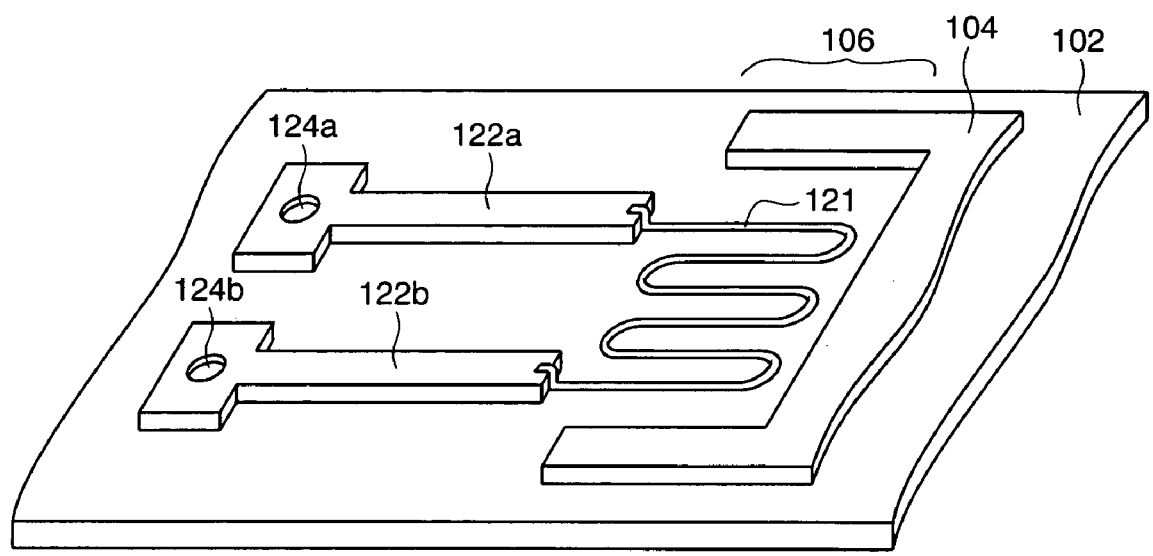
FIG. 4 is a perspective drawing of a strain gauge.

Referring to FIG. 4, a perspective drawing of a strain gauge 106 is shown. The strain gauge 106 may be implemented as one or more resistive metal foils 121 formed on an insulating layer 102. Each metal foil 121 may be connected to traces 122a–122b created in a conductive layer 104. The traces 120a–120b may include vias 124a–124b that extent thru the top surface conductive layer 104a. The vias 124a–124b may be plated to provide electrical connections between the traces 122a–122b and the interfaces 112a–112k formed in the top conductive layer 104a.

Figure 5:
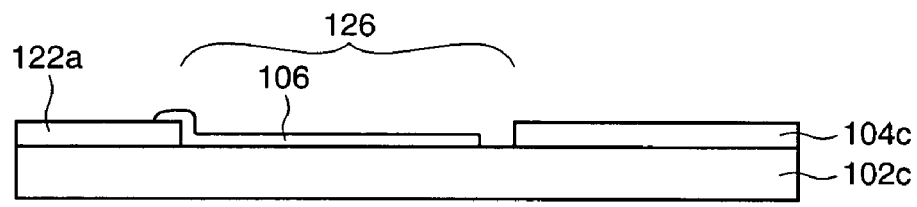
FIG. 5 is a cross-section drawing of the circuit board during a step of fabrication.
Figure 6:
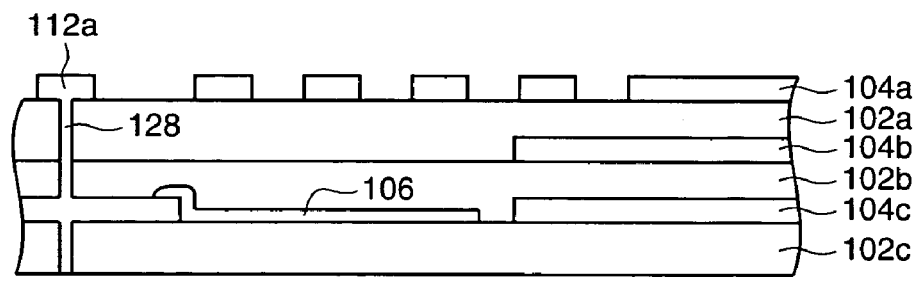
FIG. 6 is a cross-section drawing of the circuit board during another step of fabrication.

Referring to FIGS. 5 and 6, cross-section drawings of the circuit board 100 during various steps of fabrication are shown. FIG. 5 generally illustrates an insulating layer 102c having a conductive layer 104c. The conductive layer 104c may be patterned to open an area 126 where a strain gauge 106 may be formed. The strain gauge 106 may be formed by deposition/plating a layer of strain gauge material and subsequent etching of the strain gauge material, similar to other traces in the metal layers 104a–104n. The strain gauge 106 may also be fabricated separately from the metal layers 104a–104n and attached to a particular insulating layer (e.g., 102c) after etching the associated conductive layer (e.g., 104c).

FIG. 6 generally illustrates additional insulating layers 102a–102b and conductive layers 104a–104b formed over the strain gauge 106. The top conductive layer 104a may configured to include the interfaces 112a–112k. Two of the interfaces 112a–112k may be connected to the traces 122a–122b in the third conductive layer 104c through via plating. For example, the interface 112a may be connected to the trace 124b and strain gauge 106 with a plating 128.

Figure 7:
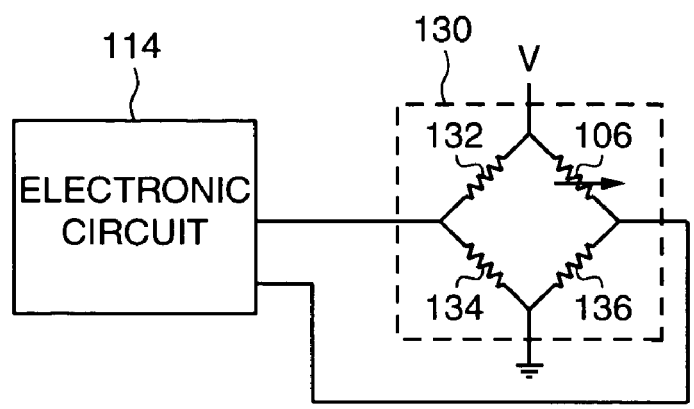
FIG. 7 is a schematic of a circuit configured to measure a force.

Referring to FIG. 7, a schematic of a circuit 130 configured to measure a force is shown. The circuit 130 generally comprises the electronic circuit 114, the strain gauge 106 and resistors 132, 134 and 136. The strain gauge 106 and the resistors 132, 134 and 136 may be configured as a Wheatstone bridge. The electronic circuit 114 may be connected to the Wheatstone bridge 138 to measure changes in a resistance of the strain gauge 106 due to stress in the circuit board 100. In one embodiment, the resistors 132, 134 and 136 may be implemented off the circuit board 100. In another embodiment, the resistors 132, 134 and 136 may be fabricated between the insulating layers 102a–102n of the circuit board 100. In particular, the resistors 132, 134 and 136 disposed within the circuit board 100 may be fabricated between the same insulating layers 102a–102n as the associated strain gauge 106. The metal traces formed from the associated conductive layer 104 may be used to establish the Wheatstone bridge. In still another embodiment, the resistor 134 may be implemented as another of the strain gauges 106a–106g disposed approximate the strain gauge 106.

Figure 8:
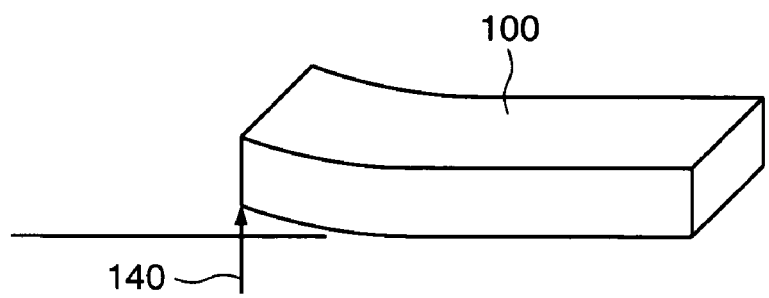
FIG. 8 is a perspective drawing of the circuit board receiving a bowing force.

Referring to FIG. 8, a perspective drawing of the circuit board 100 receiving a bowing force 140 is shown. The bowing force 140 may operate to displace one or more sides of the circuit board 100 out of an at-rest plane.

Figure 9:
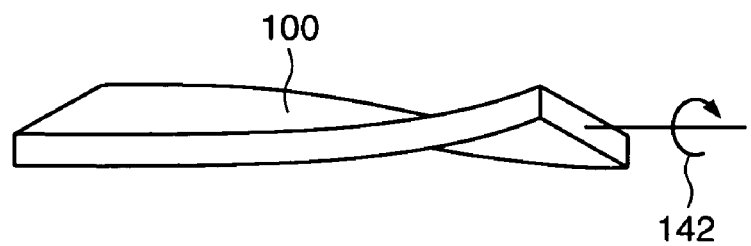
FIG. 9 is a perspective drawing of the circuit board receiving a twisting force.

Referring to FIG. 9, a perspective drawing of the circuit board 100 receiving a twisting force 142 is shown. The twisting force 142 may operate to displace one or more corners of the circuit board 100 above the at-rest plane and one or more opposing corners of the circuit board 100 below the at-rest plane.

The various signals of the present invention are generally shown on individual inputs and outputs. In other embodiments, some or all of the various signals may be multiplexed through one or more inputs and/or outputs as desired or needed.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a circuit board having a plurality of insulating layers and a top surface;
   a first strain gauge disposed between two of said insulating layers;
   a plurality of traces disposed between said two insulating layers and connected to said first strain gauge; and
   an external interface disposed on said top layer and connected to said traces to provide direct communication with said first strain gauge, wherein said first strain gauge is located within said top surface and positioned to measure a force applied to a component configured to mount the component.

2. The apparatus according to claim 1, wherein said circuit board has a region on said top surface (i) for mechanically attaching said component to said top surface and (ii) aligned with said first strain gauge through a line normal to said top surface.

3. The apparatus according to claim 2, where said first strain gauge is located within said region and positioned to measure a force applied to said component.

4. The apparatus according to claim 1, further comprising a second strain gauge disposed between two of said insulating layers.

5. The apparatus according to claim 4, wherein both said first strain gauge and said second strain gauge are disposed on a common layer of said insulating layers.

6. The apparatus according to claim 4, further comprising:
   a third strain gauge disposed between two of said insulating layers; and
   a fourth strain gauge disposed between two of said insulating layers, wherein said first strain gauge, said second strain gauge, said third strain gauge and said fourth strain gauge are coplanar.

7. The apparatus according to claim 6, wherein each of said first strain gauge, said second strain gauge, said third strain gauge and said fourth strain gauge are located in a respective corner of a region on said circuit board defined by a component mechanically mounted to said top surface.

8. The apparatus according to claim 4, wherein both of said first strain gauge and said second strain gauge are located along a line normal to a top surface of said circuit board at different depths suitable for measuring a twisting of said circuit board.

9. The apparatus according to claim 8, further comprising a third strain gauge disposed between two of said insulating layers along said line.

10. The apparatus according to claim 1, wherein said external interface is positioned outside all areas where said circuit board contacts test equipment.

11. The apparatus according to claim 1, further comprising a plurality of resistors (i) disposed between two of said insulating layers and (ii) connected to said first strain gauge.

12. A method for fabricating a circuit board, comprising the steps of:
(A) forming a plurality of first traces in a first conductive layer disposed on a first insulating layer of said circuit board;
(B) establishing at least one first strain gauge on said first insulating layer in connection with said first traces after forming said first traces;
(C) covering said first strain gauge with a second insulating layer; and
(D) forming a plurality of external connections (i) on a top layer of said circuit board and (ii) in direct communication with said first strain gauge, wherein said first strain gauge is located within said top surface and positioned to measure a force applied to a component configured to mount the component.

13. The method according to claim 12, where said first strain gauge is at least four strain gauges disposed between said first insulating layer and said second insulating layer.

14. The method according to claim 12, further comprising the steps of:
forming a plurality of second traces in a second conductive layer disposed on said second insulating layer;
establishing at least one second strain gauge on said second insulating layer connected to said second traces;
covering said second strain gauge with a third insulating layer; and
forming a plurality of direct connections between said second strain gauge and a subset of said external connections.

15. The method according to claim 12, wherein step (A) comprises the sub-step of:
patterning an open area in said first conductive layer in which said first strain gauge will be located.

16. The method according to claim 15, wherein step (B) comprises the sub-step of:
depositing material for creating said first strain gauge onto said first insulating area in at least said open area.

17. A method for using a circuit board, comprising the steps of:
(A) applying a force to said circuit board;
(B) generating a first electrical signal by measuring a first strain at a first location between two of a plurality of insulating layers of said circuit board caused by said force; and
(C) transferring said first electrical signal to an external interface on a top surface of said circuit board, wherein said first strain gauge is located within said top surface and positioned to measure a force applied to a component configured to mount the component.

18. The method according to claim 17, further comprising the step of:
generating a second electrical signal by measuring a second strain at a second location between said two insulating layers caused by said force.

19. The method according to claim 17, further comprising the step of:
generating a second electrical signal by measuring a second strain at a second location between two of said insulating layers, wherein said second location is non-coplanar with said first location.

20. The method according to claim 17, wherein said force is applied to said circuit board through a component located on an outer surface of said circuit board.

* * * * *